United States Patent
Lee

(10) Patent No.: US 9,024,200 B2
(45) Date of Patent: May 5, 2015

(54) ARRAY-TYPE MULTILAYER CERAMIC ELECTRONIC COMPONENT, BOARD FOR MOUNTING THE SAME, AND METHOD OF MANUFACTURING THE SAME

(71) Applicant: Samsung Electro-Mechanics Co., Ltd., Suwon, Gyunggi-do (KR)

(72) Inventor: Chang Ho Lee, Gyunggi-do (KR)

(73) Assignee: Sansum Electro-Mechanics Co., Ltd., Suwon, Gyunggi-Do (KR)

( * ) Notice: Subject to any disclaimer, the term of this patent is extended or adjusted under 35 U.S.C. 154(b) by 16 days.

(21) Appl. No.: 14/060,491

(22) Filed: Oct. 22, 2013

(65) Prior Publication Data

US 2015/0021076 A1   Jan. 22, 2015

(30) Foreign Application Priority Data

Jul. 22, 2013   (KR) .................. 10-2013-0086326

(51) Int. Cl.
*H05K 1/00*     (2006.01)
*H01G 4/30*     (2006.01)
*H01G 2/06*     (2006.01)
*H05K 1/18*     (2006.01)
*H05K 3/46*     (2006.01)

(52) U.S. Cl.
CPC .................. *H01G 4/30* (2013.01); *H01G 2/065* (2013.01); *H05K 1/181* (2013.01); *H05K 3/4629* (2013.01)

(58) Field of Classification Search
CPC ............................ H05K 1/181; H05K 3/4629
See application file for complete search history.

(56) References Cited

FOREIGN PATENT DOCUMENTS

KR   10-2005-0044083 A   5/2005
KR   10-2005-0096454 A   10/2005

*Primary Examiner* — Jeremy C Norris
(74) *Attorney, Agent, or Firm* — McDermott Will & Emery LLP

(57) ABSTRACT

There is provided an array type multilayer ceramic electronic component including a ceramic body having a plurality of dielectric layers stacked in a length direction, a first capacitor part including a plurality of first and second internal electrodes alternately exposed through both side surfaces of the ceramic body, a second capacitor part disposed to be spaced apart from the first capacitor part and including a plurality of third and fourth internal electrodes, a first external electrode formed on one side surface, a second external electrode disposed to be spaced apart from the first external electrode, formed on one side surface of the ceramic body, and a third external electrode formed on the other side surface of the ceramic body.

18 Claims, 5 Drawing Sheets

ARRAY-TYPE MULTILAYER CERAMIC ELECTRONIC COMPONENT, BOARD FOR MOUNTING THE SAME, AND METHOD OF MANUFACTURING THE SAME

CROSS-REFERENCE TO RELATED APPLICATION

This application claims the benefit of Korean Patent Application No. 10-2013-0086326 filed on Jul. 22, 2013, with the Korean Intellectual Property Office, the disclosure of which is incorporated herein by reference.

BACKGROUND OF THE INVENTION

1. Field of the Invention

The present invention relates to an array-type multilayer ceramic electronic component, a board for mounting the same, and a method of manufacturing the same.

2. Description of the Related Art

An example of electronic components using a ceramic material includes a capacitor, an inductor, a piezoelectric element, a varistor, a thermistor, and the like.

Among the ceramic electronic components, a multilayer ceramic capacitor (MLCC) has advantages such as a small size, high capacitance, ease of mounting, and the like.

The multilayer ceramic capacitor is a chip type condenser mounted on a printed circuit board of several electronic products such as image devices, for example, liquid crystal displays (LCDs), plasma display panels (PDP), and the like, computers, personal digital assistants (PDAs), cellular phones, and the like, to serve to charge or discharge electricity.

The multilayer ceramic capacitor is manufactured by alternately stacking a plurality of dielectric layers and internal electrodes to form a multilayer laminate, firing the multilayer laminate, and installing external electrodes. Generally, capacitance of the multilayer ceramic capacitor is determined depending on the number of stacked internal electrodes.

In order to mount the multilayer ceramic capacitor on the printed circuit board, a predetermined area is required.

Here, in the case in which a plurality of multilayer ceramic capacitors are mounted on a single printed circuit board, a predetermined space should be secured in order for the respective multilayer ceramic capacitor to be appropriately operated.

Recently, in accordance with miniaturization of electronic products, the multilayer ceramic capacitor used in the electronic products is also required to be microminiaturized and have an ultra high capacitance.

However, in the case in which the electronic product is thinned and miniaturized, a space in which the multilayer ceramic capacitor may be mounted is limited, such that it may be difficult to design the product.

Therefore, there was a limitation in miniaturizing the electronic product in order to simultaneously mount a plurality of multilayer ceramic capacitors on a single printed circuit board.

Meanwhile, some multilayer ceramic capacitors in a safety mode for preventing a defect due to cracks such as warpage, or the like, have been disclosed.

As the multilayer ceramic capacitor in a safety mode according to the related art, there is a product in which a margin part of a dielectric layer is increased or an internal electrode is used as a float electrode structure, or the like. However, in this structure, it may be difficult to implement high capacitance of the product.

The following Related Art Documents relate to an array type electronic component and disclose a structure in which a plurality of dielectric layers are stacked in a thickness direction, but do not disclose a multilayer ceramic capacitor in a safety mode capable of implementing high capacitance.

RELATED ART DOCUMENT

Korean Patent Laid-Open Publication No. 10-2005-0044083
Korean Patent Laid-Open Publication No. 10-2005-0096454

SUMMARY OF THE INVENTION

An aspect of the present invention provides an array type multilayer ceramic electronic component capable of decreasing a size of a board by significantly decreasing an area required for mounting a plurality of multilayer ceramic electronic components when the plurality of multilayer ceramic electronic components are mounted on a single board.

An aspect of the present invention also provides a multilayer ceramic capacitor in a safety mode, capable of implementing high capacitance and preventing a defect due to cracks such as warpage, or the like.

According to an aspect of the present invention, there is provided an array type multilayer ceramic electronic component including: a ceramic body having a plurality of dielectric layers stacked in a length direction; a first capacitor part including a plurality of first and second internal electrodes alternately exposed through both side surfaces of the ceramic body, having the dielectric layer interposed therebetween; a second capacitor part disposed to be spaced apart from the first capacitor part in the length direction and including a plurality of third and fourth internal electrodes alternately exposed through both side surfaces of the ceramic body, having the dielectric layer interposed therebetween; a first external electrode formed on one side surface of the ceramic body and connected to exposed one end portions of the first and second internal electrodes; a second external electrode disposed to be spaced apart from the first external electrode in the length direction, formed on one side surface of the ceramic body, and connected to exposed one end portions of the third and fourth internal electrodes; and a third external electrode formed on the other side surface of the ceramic body and connecting the exposed other end portions of the first and second internal electrodes and the exposed other end portions of the third and fourth internal electrodes, to each other in series.

The first to third external electrodes may be extended from both side surfaces of the ceramic body to portions of one main surface of the ceramic body.

The first to third external electrodes may be extended from both side surfaces of the ceramic body to portions of both main surfaces of the ceramic body.

The dielectric layer of a section in which the first and second capacitor parts are divided from each other in the ceramic body may be formed of a material having a dielectric constant lower than those of the dielectric layers of the first and second capacitor parts.

According to another aspect of the present invention, there is provided an array type multilayer ceramic electronic component including: a ceramic body having a plurality of dielectric layers stacked in a length direction; a first capacitor part including a plurality of first and second internal electrodes alternately exposed through both side surfaces of the ceramic body, having the dielectric layer interposed therebetween; a second capacitor part disposed to be spaced apart from the first capacitor part in the length direction and including a plurality of third and fourth internal electrodes alternately exposed through both side surfaces of the ceramic body, having the dielectric layer interposed therebetween; a third capacitor part disposed to be spaced apart from the second capacitor part in the length direction and including a plurality of fifth and sixth internal electrodes alternately exposed through both side surfaces of the ceramic body, having the dielectric layer interposed therebetween; a first external electrode formed on one side surface of the ceramic body and connected to exposed one end portions of the first and second internal electrodes; a second external electrode disposed to be spaced apart from the first external electrode in the length direction, formed on one side surface of the ceramic body, and connecting exposed one end portions of the third and fourth internal electrodes and exposed one end portions of the fifth and sixth internal electrodes, to each other in series; a third external electrode formed on the other side surface of the ceramic body and connecting the exposed other end portions of the first and second internal electrodes and the exposed other end portions of the third and fourth internal electrodes, to each other in series; and a fourth external electrode disposed to be spaced apart from the third external electrode in the length direction, formed on the other side surface of the ceramic body, and connected to the exposed other end portions of the fifth and sixth internal electrodes.

The first to fourth external electrodes may be extended from both side surfaces of the ceramic body to portions of one main surface of the ceramic body.

The first to fourth external electrodes may be extended from both side surfaces of the ceramic body to portions of both main surfaces of the ceramic body.

The dielectric layers of sections in which the first to third capacitor parts are divided from each other in the ceramic body may be formed of a material having a dielectric constant lower than those of the dielectric layers of the first to third capacitor parts.

According to another aspect of the present invention, there is provided a board for mounting an array type multilayer ceramic electronic component, including: a printed circuit board including first and second electrode pads disposed on an upper surface thereof so as to be spaced apart from each other by a predetermined interval in a length direction and a third electrode pad disposed on the upper surface thereof so as to oppose the first and second electrode pads in a width direction; and the array type multilayer ceramic electronic component as described above mounted on the first to third electrode pads.

According to another aspect of the present invention, there is provided a method of manufacturing an array type multilayer ceramic electronic component, including: forming a first capacitor part by stacking a plurality of ceramic sheets having first and second internal electrodes formed thereon so that the first and second internal electrodes are disposed to face each other, having the ceramic sheet interposed therebetween; forming a second capacitor part by stacking a plurality of ceramic sheets having third and fourth internal electrodes formed thereon so that the third and fourth internal electrodes are disposed to face each other, having the ceramic sheet interposed therebetween; preparing a multilayer laminate by stacking and pressing the first and second capacitor parts in a length direction so that a buffer layer formed of a plurality of ceramic sheets is disposed between the first and second capacitor parts; preparing a ceramic body having first and second main surfaces opposing each other in a thickness direction, first and second end surfaces opposing each other in the length direction, and first and second side surfaces opposing each other in a width direction, to which the first and second internal electrodes are alternately exposed, by cutting the multilayer laminate into regions corresponding to respective single chips to then be fired; forming first and second external electrodes on the first side surface of the ceramic body so as to be spaced apart from each other and be connected to exposed one end portions of the first and second internal electrodes and exposed one end portions of the third and fourth internal electrodes, respectively; and forming a third external electrode on the second side surface of the ceramic body so as to connect the exposed other end portions of the first and second internal electrodes and the exposed other end portions of the third and fourth internal electrodes, to each other in series.

In the forming of the first to third external electrodes, the first to third external electrodes may be extended from the first and second side surfaces of the ceramic body to portions of the first or second main surface of the ceramic body.

In the forming of the first to third external electrodes, the first to third external electrodes may be extended from the first and second side surfaces of the ceramic body to portions of the first and second main surfaces of the ceramic body.

In the preparing of the multilayer laminate, the ceramic sheet of the buffer layer may be formed of a material having a dielectric constant lower than those of the ceramic sheets of the first and second capacitor parts.

According to another aspect of the present invention, there is provided a method of manufacturing an array type multilayer ceramic electronic component, including: forming a first capacitor part by stacking a plurality of ceramic sheets having first and second internal electrodes formed thereon so that the first and second internal electrodes are disposed to face each other, having the ceramic sheet interposed therebetween; forming a second capacitor part by stacking a plurality of ceramic sheets having third and fourth internal electrodes formed thereon so that the third and fourth internal electrodes are disposed to face each other, having the ceramic sheet interposed therebetween; forming a third capacitor part by stacking a plurality of ceramic sheets having fifth and sixth internal electrodes formed thereon so that the fifth and sixth internal electrodes are disposed to face each other, having the ceramic sheet interposed therebetween; preparing a multilayer laminate by stacking and pressing the first to third capacitor parts in a length direction so that buffer layers formed of a plurality of ceramic sheets are disposed between the first to third capacitor parts, respectively; preparing a ceramic body having first and second main surfaces opposing each other in a thickness direction, first and second end surfaces opposing each other in the length direction, and first and second side surfaces opposing each other in a width direction, to which the first and second internal electrodes are alternately exposed, by cutting the multilayer laminate into regions corresponding to respective single chips to then be fired; forming a first external electrode on one side surface of the ceramic body so as to be connected to exposed one end portions of the first and second internal electrodes; forming a second external electrode on one side surface of the ceramic body so as to connect exposed one end portions of the third and fourth internal electrodes and exposed one end portions of the fifth and sixth internal electrodes, to each other in series; forming a third external electrode on the other side surface of the ceramic body so as to connect the exposed other end portions of the first and second internal electrodes and the exposed other end portions of the third and fourth internal electrodes, to each other in series; and forming a fourth external electrode on the other side surface of the ceramic body so as to be connected to the exposed other end portions of the fifth and sixth internal electrodes.

In the forming of the first to fourth external electrodes, the first to fourth external electrodes may be extended from the first and second side surfaces of the ceramic body to portions of the first or second main surface of the ceramic body.

In the forming of the first to fourth external electrodes, the first to fourth external electrodes may be extended from the first and second side surfaces of the ceramic body to portions of the first and second main surfaces of the ceramic body.

In the preparing of the multilayer laminate, the ceramic sheet of the buffer layer may be formed of a material having a dielectric constant lower than those of the ceramic sheets of the first and second capacitor parts.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
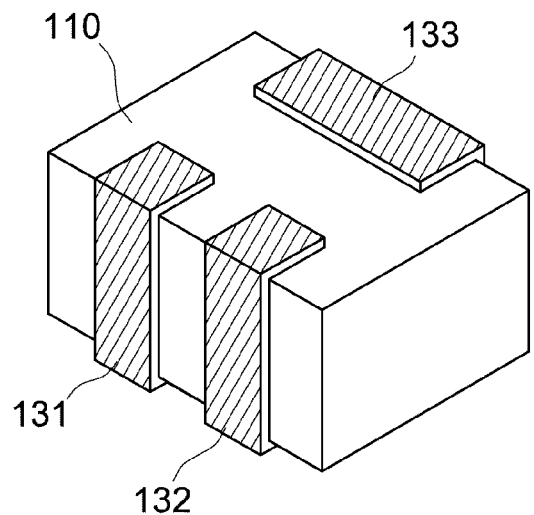
FIG. 1 is a perspective view schematically showing an array type multilayer ceramic capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Hereinafter, an array type multilayer ceramic electronic component according to the embodiment of the present invention will be described. Particularly, an array type multilayer ceramic capacitor will be described. However, the present invention is not limited thereto.

Array Type Multilayer Ceramic Capacitor

Figure 2:
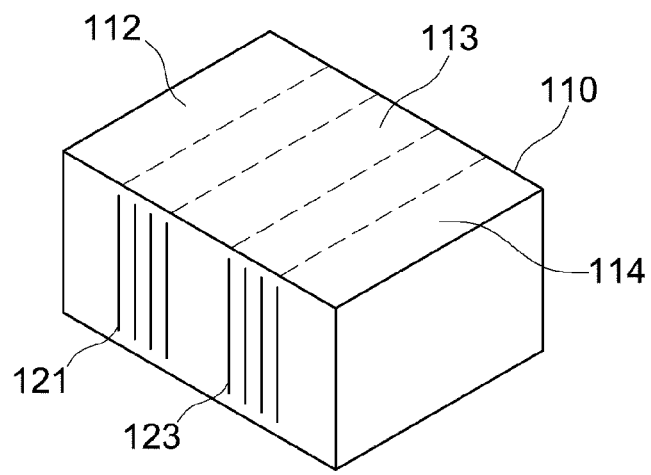
FIG. 2 is a perspective view showing a ceramic body and an internal electrode of the array type multilayer ceramic capacitor according to the embodiment of the present invention.

FIG. 1 is a perspective view schematically showing an array type multilayer ceramic capacitor according to an embodiment of the present invention; and FIG. 2 is a perspective view showing a ceramic body and an internal electrode of the array type multilayer ceramic capacitor according to the embodiment of the present invention.

Referring to FIGS. 1 and 2, the array type multilayer ceramic capacitor 100 according to the embodiment of the present invention may include a ceramic body 110, a first capacitor part including a plurality of first and second internal electrodes 121 and 122, a second capacitor part including a plurality of third and fourth internal electrodes 123 and 124, and first to third external electrodes 131, 132, and 133.

A buffer layer 113 in which the internal electrodes are not formed may be interposed between the first and second capacitor parts, and cover layers 112 and 114 may be disposed on both end portions of the ceramic body 110 in a length direction thereof.

The ceramic body 110 may be formed by stacking a plurality of dielectric layers 111 in the length direction and then firing the plurality of dielectric layers 111. Adjacent dielectric layers 111 may be integrated with each other so as not to confirm a boundary therebetween without using a scanning electron microscope (SEM).

A shape of the ceramic body 110 is not particularly limited. For example, the ceramic body 110 may have a hexahedral shape.

Further, in the present embodiment, for convenience of explanation, end surfaces of the ceramic body 110 opposing each other in a thickness direction will be defined as first and second main surfaces, end surfaces connecting the first main surface to the second main surface and opposing each other in the length direction will be defined as first and second end surfaces, and surfaces opposing each other in a width direction will be defined as first and second side surfaces.

The dielectric layer 111 may include a high-k ceramic material, for example, a barium titanate ($BaTiO_3$) based ceramic powder, or the like. However, the present invention is not limited thereto as long as a sufficient capacitance may be obtained.

In addition, the dielectric layer 111 may further include various kinds of ceramic additives such as transition metal oxide or carbide, rare earth elements, magnesium (Mg), aluminum (Al), or the like, organic solvents, plasticizers, binders, dispersants, and the like, in addition to the ceramic powder as necessary.

Figure 3:
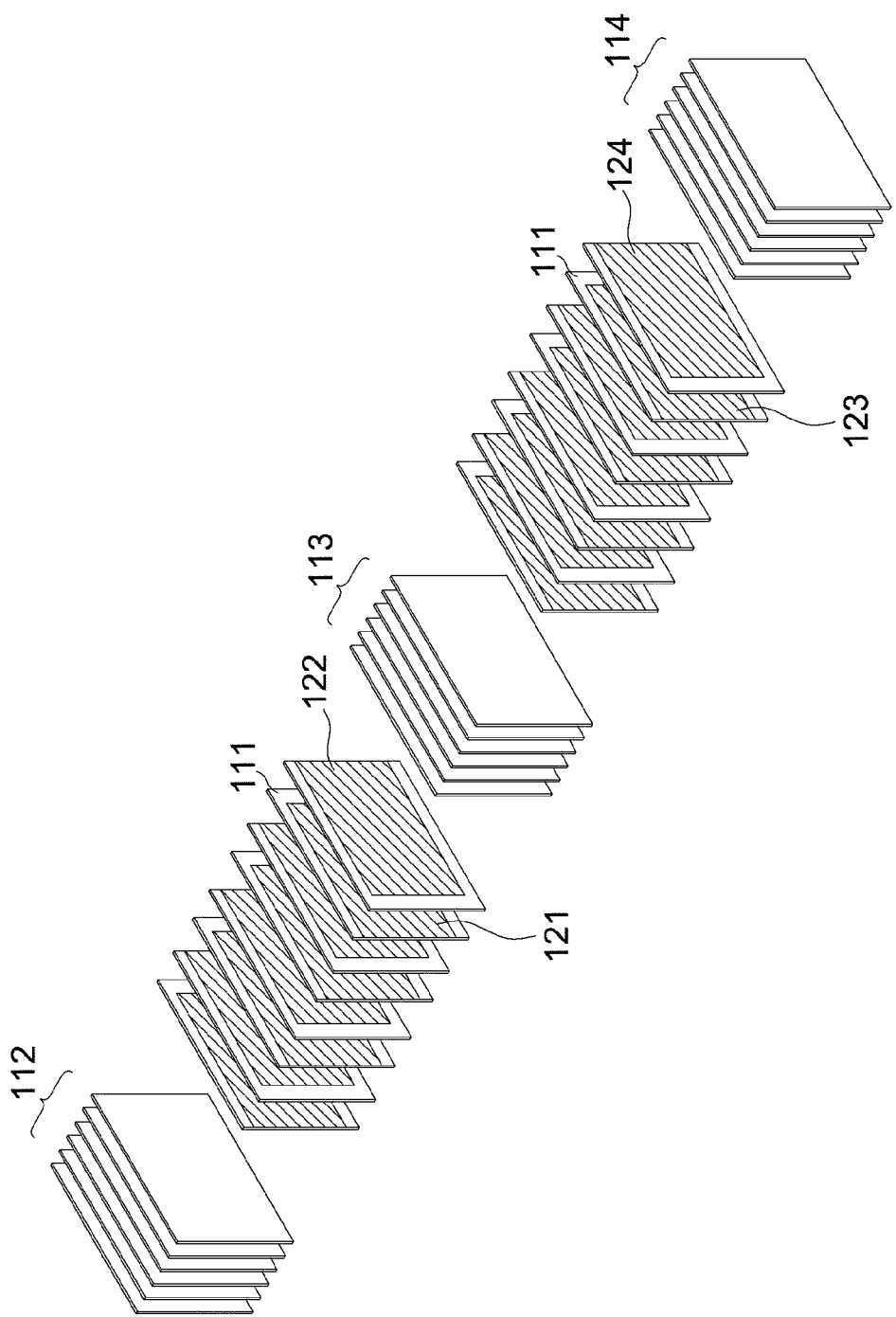
FIG. 3 is an exploded perspective view showing a stacking structure of a capacitor part and a buffer layer of the array type multilayer ceramic capacitor according to the embodiment of the present invention.

FIG. 3 is an exploded perspective view showing a stacking structure of a capacitor part and a buffer layer of the array type multilayer ceramic capacitor according to the embodiment of the present invention.

Referring to FIG. 3, the first and second capacitor parts may be disposed to be spaced apart from each other by a predetermined interval in the length direction of the ceramic body 110 in a state in which the buffer layer 113 formed of a plurality of ceramic sheets is interposed therebetween, and the cover layers 112 and 114 formed of a plurality of ceramic sheets may be disposed on both end portions of the ceramic body 110 in the length direction.

The buffer layer 113 and the cover layers 112 and 114 may have the same structure as those of the dielectric layers 111 of the first and second capacitor parts except that the internal electrodes are not formed on the buffer layer 113 and the cover layers 112 and 114.

However, the present invention is not limited thereto. For example, a dielectric layer of the buffer layer 113 may be formed of a material having a dielectric constant lower than those of the dielectric layers 111 of the first and second capacitor parts.

In this case, a parasitic capacitance generated between the first and second capacitor parts may be more effectively removed.

The first internal electrode 121 of the first capacitor part and the third internal electrode 123 of the second capacitor part, and the second internal electrode 122 of the first capacitor part and the fourth internal electrode 124 of the second capacitor part, having different polarities, may be alternately disposed to face each other, having the ceramic sheet interposed therebetween, and be alternately exposed through the first and second side surfaces of the ceramic body 110.

The first to fourth internal electrodes 121 to 124 may be electrically insulated from each other by the dielectric layers 111 interposed therebetween.

In addition, the first to fourth internal electrodes 121, 122, 123, and 124 may be formed of a conductive material, for example, any one of silver (Ag), palladium (Pd), platinum (Pt), nickel (Ni), and copper (Cu) or an alloy thereof. However, the present invention is not limited thereto.

The first external electrode 131 may be extended from the first side surface of the ceramic body 110 to a portion of the second main surface of the ceramic body 110 in order to provide a lower mounting surface and may contact and be electrically connected to one end portions of the first and second internal electrodes 121 and 122 exposed to the first side surface.

The second external electrode 132 may be disposed on the first side surface of the ceramic body 110 to be spaced apart from the first external electrode 131 in the length direction, be extended from the first side surface of the ceramic body 110 to a portion of the second main surface of the ceramic body 110 in order to provide the lower mounting surface, and may contact and be electrically connected to one end portions of the third and fourth internal electrodes 123 and 124 exposed to the first side surface.

The third external electrode 133 may be extended from the second side surface of the ceramic body 110 to a portion of the second main surface of the ceramic body 110 in order to provide the lower mounting surface and may connect the other end portions of the first and second internal electrodes 121 and 122 exposed to the second side surface and the other end portions of the third and fourth internal electrodes 123 and 124 exposed to the second side surfaces to each other in series.

When the first and second capacitor parts are connected to each other in series as described above, a voltage is divided, such that an actual voltage is decreased, whereby the array type multilayer ceramic capacitor may be easily used as a high voltage product.

Here, the first to third external electrodes 131 to 133 may be extended from the first and second side surfaces of the ceramic body 110 to a portion of the first main surface of the ceramic body 110.

In the case in which internal and external structures of the array type multilayer ceramic capacitor 100 are formed as vertical symmetrical structures by extending the first to third external electrodes 131 to 133 to the first main surface of the ceramic body 110, since directivity of the capacitor may be removed, either of the first and second main surfaces of the ceramic body 110 may be provided as the mounting surface at the time of surface-mounting the capacitor.

Therefore, at the time of mounting the array type multilayer ceramic capacitor 100 on a printed circuit board, a direction of the mounting surface needs not to be considered.

In addition, the first to third external electrodes 131 to 133 may be formed of a conductive metal, for example, silver (Ag), nickel (Ni), copper (Cu), or the like.

The first to third external electrodes 131 to 133 may be formed by applying and firing a conductive paste prepared by adding glass frit to conductive metal powder. However, the present invention is not limited thereto.

In addition, a plating layer (not shown) may be formed on the mounting surface of the first to third external electrodes 131 to 133, that is, the second main surface in the present embodiment, as necessary.

The plating layer may be to increase adhesion strength between the array type multilayer ceramic capacitor 100 and the printed circuit board when the array type multilayer ceramic capacitor 100 is mounted on the printed circuit board using a solder.

The plating layer may include, for example, a nickel (Ni) plating layer formed on the second main surface and a tin (Si) plating layer formed on the nickel plating layer. However, the present invention is not limited thereto.

Hereinafter, a method of manufacturing an array type multilayer ceramic capacitor according to the embodiment of the present invention will be described.

First, the plurality of ceramic sheets are prepared.

The ceramic sheet provided to form the dielectric layer of the ceramic body may be prepared by mixing ceramic powders, binders, solvents, and the like, with each other to prepare slurry and manufacturing the slurry as a sheet having thickness of several to several tens of μms by a method such as a doctor blade method, or the like.

Next, a conductive paste is printed on one surface of the respective ceramic sheets to a predetermined thickness to form the first and second internal electrodes.

As a method of printing the conductive paste, a screen printing method, a gravure printing method, or the like, may be used. The conductive paste may include metal powders, ceramic powders, silica ($SiO_2$) powders, and the like.

As the metal powder, at least one of precious metals such as silver (Ag), platinum (Pt), palladium (Pd), and the like, nickel (Ni), manganese (Mn), chrome (Cr), cobalt (Co), aluminum (Al), and copper (Cu), or an alloy thereof may be used.

Then, the plurality of ceramic sheets having the first and second internal electrodes formed thereon are stacked so that the first and second internal electrodes are disposed to face each other, having the ceramic sheet interposed therebetween, thereby forming the first and second capacitor parts.

Next, the first and second capacitor parts are stacked and pressed in the length direction while having the buffer layer formed of the plurality of ceramic sheets to be interposed therebetween, thereby preparing a multilayer laminate including the first and second capacitor parts disposed at a predetermined internal in the length direction.

Here, the ceramic sheet of the buffer layer may be formed of a material having a dielectric constant lower than that of the ceramic sheet of the capacitor part.

Then, the multilayer laminate is cut into respective single chips to then be fired to thereby prepare the ceramic bodies having the first and second main surfaces opposing each other in the thickness direction, the first and second end surfaces opposing each other in the length direction, and the first and second side surfaces opposing each other in the width direction, to which the first and second internal electrodes are alternately exposed.

Thereafter, the first and second external electrodes are formed on the first side surface of the ceramic body so as to be spaced apart from each other by a predetermined interval.

The first and second external electrodes may be electrically connected to exposed one end portions of the first and second internal electrodes of the first capacitor part, and exposed one end portions of the third and fourth internal electrodes of the second capacitor part, respectively.

In addition, the third external electrode is formed on the second side surface of the ceramic body so as to connect the exposed other end portions of the first and second internal electrodes of the first capacitor part and the exposed other end portions of the third and fourth internal electrodes of the second capacitor part, to each other in series.

Here, the first to third external electrodes may be extended from the first and second side surfaces of the ceramic body to portions of the first or second main surface of the ceramic body in order to provide a lower mounting surface.

In addition, the first to third external electrodes may be extended from the first and second side surfaces of the ceramic body to portions of the first and second main surfaces of the ceramic body to remove the directivity of the capacitor so as to allow a direction of the mounting surface not to be considered at the time of mounting the capacitor.

MODIFIED EXAMPLE

Figure 4:
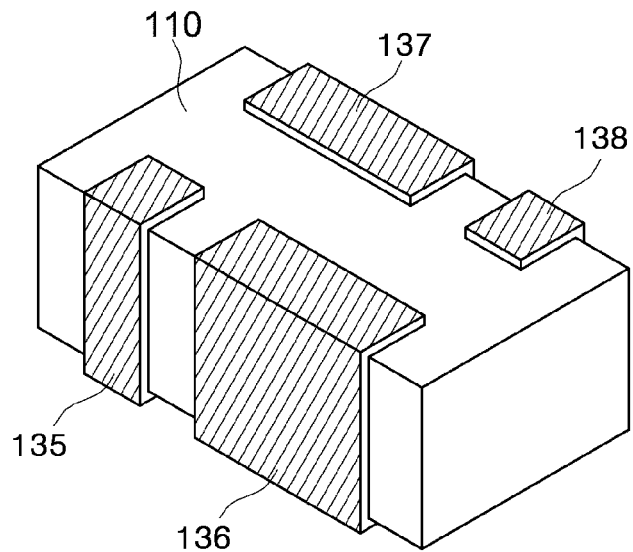
FIG. 4 is a perspective view schematically showing an array type multilayer ceramic capacitor according to another embodiment of the present invention.
Figure 5:
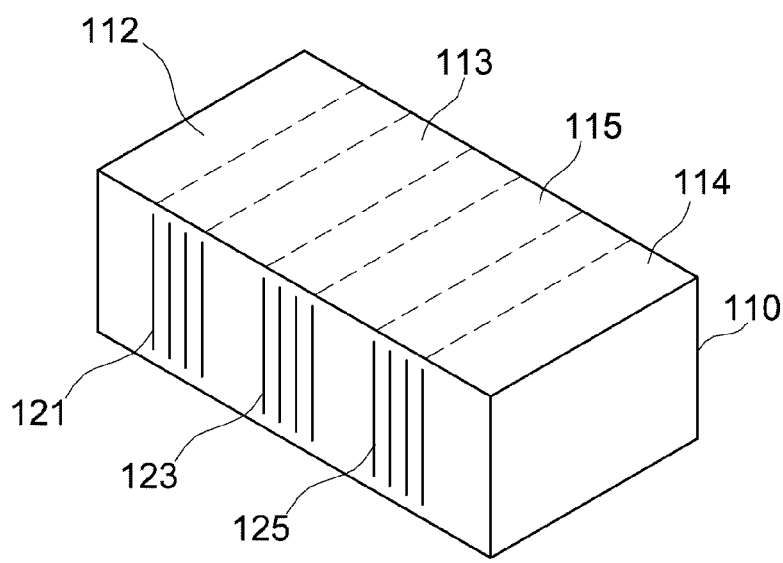
FIG. 5 is a perspective view showing a ceramic body and an internal electrode of the array type multilayer ceramic capacitor according to another embodiment of the present invention.

FIG. 4 is a perspective view schematically showing an array type multilayer ceramic capacitor according to another embodiment of the present invention; and FIG. 5 is a perspective view showing a ceramic body and an internal electrode of the array type multilayer ceramic capacitor according to another embodiment of the present invention.

Hereinafter, a detailed description of the same structure as that of the array type multilayer ceramic capacitor according to the foregoing embodiment of the present invention described above will be omitted in order to avoid an overlapped description and a structure different from that of the array type multilayer ceramic capacitor according to the embodiment of the present invention described above will be mainly described.

Referring to FIGS. 4 and 5, an array type multilayer ceramic capacitor 100' according to another embodiment of the present invention may include a ceramic body 110, a first capacitor part including a plurality of first and second internal electrodes 121 and 122, a second capacitor part including a plurality of third and fourth internal electrodes 123 and 124, a third capacitor part including a plurality of fifth and sixth internal electrodes 125 and 126, and first to fourth external electrodes 135 to 138.

A buffer layer 113 in which the internal electrodes is not formed may be interposed between the first and second capacitor parts, a buffer layer 115 in which the internal electrode is not formed may be interposed between the second and third capacitor parts, and cover layers 112 and 114 may be disposed on both end portions of the ceramic body 110 in a length direction.

Figure 6:
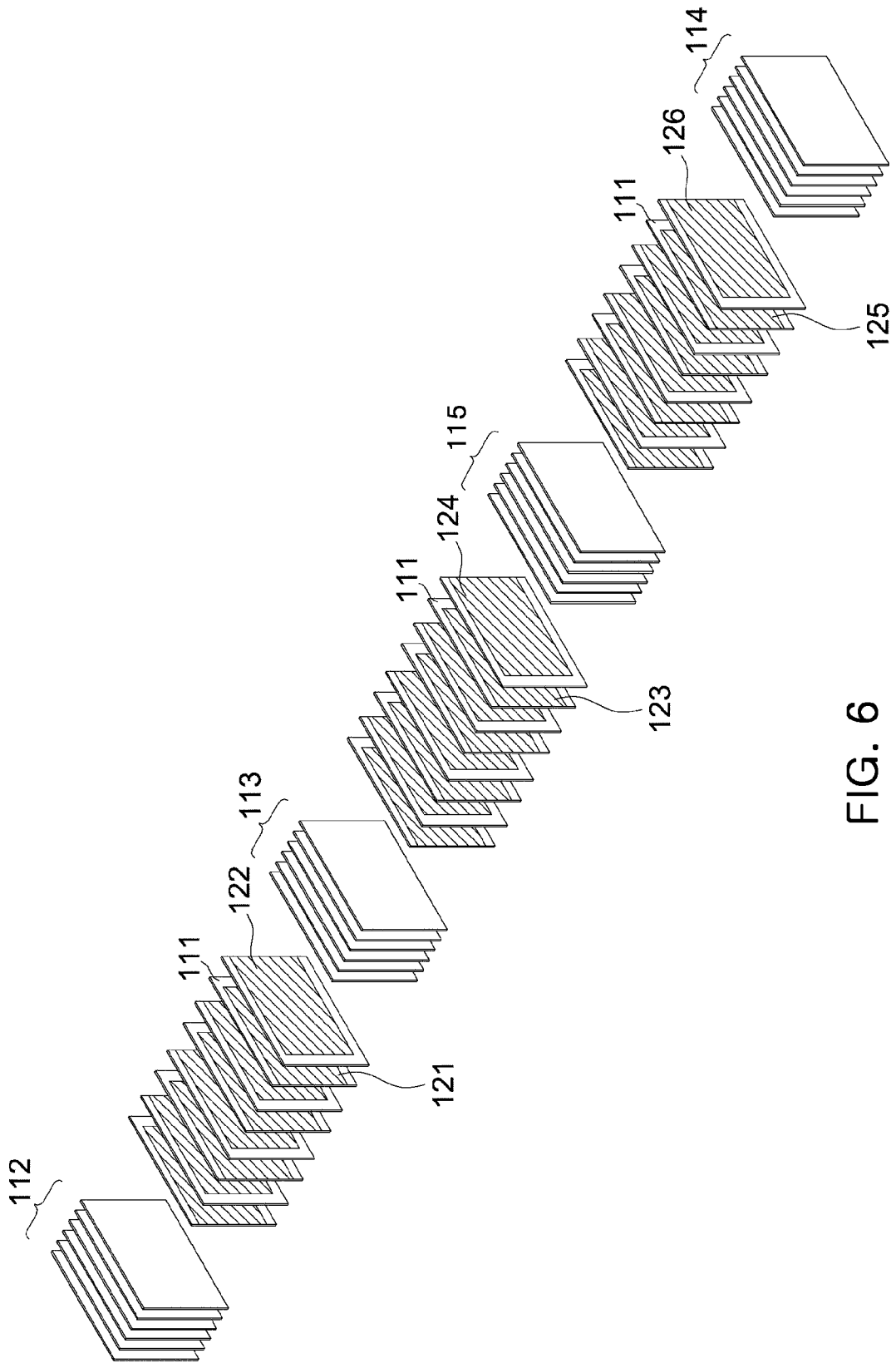
FIG. 6 is an exploded perspective view showing a stacking structure of a capacitor part and a buffer layer of the array type multilayer ceramic capacitor according to another embodiment of the present invention.

FIG. 6 is an exploded perspective view showing a stacking structure of a capacitor part and a buffer layer of the array type multilayer ceramic capacitor according to another embodiment of the present invention.

Referring to FIG. 6, the first to third capacitor parts may be disposed to be spaced apart from each other by a predetermined interval in the length direction of the ceramic body 110 in a state in which the buffer layers 113 and 115 formed of a plurality of ceramic sheets are interposed between the first and second capacitor parts and between the second and third capacitor parts, respectively, and the cover layers 112 and 114 formed of a plurality of ceramic sheets may be disposed on both end portions of the ceramic body 110 in the length direction.

The buffer layers 113 and 115 and the cover layers 112 and 114 may have the same structure as those of the dielectric layers 111 of the first to third capacitor parts except that the internal electrodes are not formed in the buffer layers 113 and 115 and the cover layers 112 and 114.

However, the present invention is not limited thereto. For example, a dielectric layer of the buffer layer 113 may be formed of a material having dielectric constant lower than those of the dielectric layers 111 of the first to third capacitor parts.

In this case, parasitic capacitance generated between the first to third capacitor parts may be more effectively removed.

The first internal electrode 121 of the first capacitor part, the third internal electrode 123 of the second capacitor part, and the fifth internal electrode 125 of the third capacitor part, and the second internal electrode 122 of the first capacitor part, the fourth internal electrode 124 of the second capacitor part, and the sixth internal electrode 126 of the third capacitor part, having different polarities, may be alternately disposed to face each other, having the ceramic sheet forming the dielectric layer 111 to be interposed therebetween, and may be alternately exposed through the first and second side surfaces of the ceramic body 110.

Here, the first to sixth internal electrodes 121 to 126 may be electrically insulated from each other by the dielectric layers 111 interposed therebetween.

The first external electrode 135 may be extended from the first side surface of the ceramic body 110 to a portion of the second main surface of the ceramic body 110 in order to provide a lower mounting surface and may contact and be electrically connected to one end portions of the first and second internal electrodes 121 and 122, exposed to the first side surface.

The second external electrode 136 may be disposed on the first side surface of the ceramic body 110 so as to be spaced apart from the first external electrode 135 in the length direction, may be extended from the first side surface of the ceramic body 110 to a portion of the second main surface of the ceramic body 110 in order to provide the lower mounting surface, and may connect one end portions of the third and fourth internal electrodes 123 and 124 exposed to the first side surface and one end portions of the fifth and sixth internal electrodes 125 and 126 exposed to the first side surface, to each other in series.

The third external electrode 137 may be extended from the second side surface of the ceramic body 110 to a portion of the second main surface of the ceramic body 110 in order to provide the lower mounting surface and may connect the other end portions of the first and second internal electrodes 121 and 122 exposed to the second side surface and one end portions of the third and fourth internal electrodes 123 and 124 exposed to the second side surface, to each other in series.

The fourth external electrode 138 may be disposed on the second side surface of the ceramic body 110 so as to be spaced apart from the third external electrode 137 in the length direction, may be extended from the second side surface of the ceramic body 110 to a portion of the second main surface of the ceramic body 110 in order to provide the lower mounting surface, and may contact and be electrically connected to the other end portions of the fifth and sixth internal electrodes 125 and 126 exposed to the second side surface.

When the first to third capacitor parts are connected to each other in series as described above, a voltage may be divided, such that an actual voltage is decreased, whereby the array type multilayer ceramic capacitor may be easily used as a high voltage product.

Specifically, when three or more capacitor parts are connected to each other in series as in the present embodiment, even in the case in which the first or third capacitor part is short-circuited due to cracks caused by warpage, or the like, at both ends of the ceramic body 110, the second capacitor part positioned in the middle of the ceramic body 110 may be implemented in a safety mode in which it is normally operated.

Here, the first to fourth external electrodes 135 to 138 may be extended from the first and second side surfaces of the ceramic body 110 to portions of the first main surface of the ceramic body 110.

That is, in the case in which internal and external structures of the array type multilayer ceramic capacitor 100' are formed as vertical symmetrical structures by extending the first to fourth external electrodes 135 to 138 to the first main surface of the ceramic body 110, since directivity of the capacitor may be removed, either of the first and second main surfaces of the ceramic body 110 may be provided as the mounting surface at the time of surface-mounting the capacitor.

Therefore, at the time of mounting the array type multilayer ceramic capacitor 100' on a printed circuit board, a direction of the mounting surface needs not to be considered.

In addition, a plating layer (not shown) may be formed on the mounting surface of the first to fourth external electrodes 135 to 138, that is, the second main surface in the present embodiment, as necessary.

Hereinafter, a method of manufacturing an array type multilayer ceramic capacitor according to another embodiment of the present invention will be described.

First, a plurality of ceramic sheets are prepared.

The ceramic sheet used to form the dielectric layer of the ceramic body may be prepared by mixing ceramic powders, binders, solvents, and the like, with each other to prepare slurry and manufacturing the slurry as a sheet having a thickness of several to several tens of μms by a method such as a doctor blade method, or the like.

Next, a conductive paste is printed on one surface of the respective ceramic sheets to a predetermined thickness to form the first and second internal electrodes.

As a method of printing the conductive paste, a screen printing method, a gravure printing method, or the like, may be used. The conductive paste may include metal powders, ceramic powders, silica ($SiO_2$) powders, and the like.

As the metal powder, at least one of a precious metal such as silver (Ag), platinum (Pt), palladium (Pd), or the like, nickel (Ni), manganese (Mn), chrome (Cr), cobalt (Co), aluminum (Al), and copper (Cu), or an alloy thereof may be used.

Then, the plurality of ceramic sheets having the first and second internal electrodes formed thereon, the third and fourth internal electrode formed thereon, and the fifth and sixth internal electrodes formed thereon are stacked so that the internal electrodes having different polarities are disposed to face each other, having the ceramic sheet interposed therebetween, thereby forming the first to third capacitor parts.

Next, the first to third capacitor parts are stacked and pressed in the length direction so that the buffer layers formed of the plurality of ceramic sheets are disposed therebetween, respectively, thereby preparing a multilayer laminate including the first to third capacitor parts disposed to be spaced apart from each other by a predetermined internal in the length direction.

The ceramic sheet of the buffer layer may be formed of a material having a dielectric constant lower than that of the ceramic sheet of the capacitor part.

Then, the multilayer laminate is cut into respective single chips to be fired to thereby prepare ceramic bodies respectively having first and second main surfaces opposing each other in the thickness direction, first and second end surfaces opposing each other in the length direction, and first and second side surfaces opposing each other in the width direction, to which the first and second internal electrodes are alternately exposed.

Thereafter, the first and second external electrodes are formed on the first side surface of the ceramic body so as to be spaced apart from each other by a predetermined interval.

The first external electrode may be electrically connected to exposed one end portions of the first and second internal electrodes of the first capacitor part.

The second external electrode may connect exposed one end portions of the third and fourth internal electrodes of the second capacitor part and exposed one end portions of the fifth and sixth internal electrodes of the third capacitor part, to each other in series.

Thereafter, the third and fourth external electrodes are formed on the second side surface of the ceramic body so as to be spaced apart from each other by a predetermined interval.

The third external electrode may connect the exposed other end portions of the first and second internal electrodes of the first capacitor part, and the exposed other end portions of the third and fourth internal electrodes of the second capacitor part, to each other in series.

The fourth external electrode may be electrically connected to the exposed other end portions of the fifth and sixth internal electrodes of the third capacitor part.

Here, the first to fourth external electrodes may be extended from the first and second side surfaces of the ceramic body to portions of the first or second main surface of the ceramic body in order to provide lower surface mounting.

In addition, the first to fourth external electrodes may be extended from the first and second side surfaces of the ceramic body to portions of the first and second main surfaces of the ceramic body so as to remove the directivity of the capacitor to allow a direction of the mounting surface not to be considered at the time of mounting the capacitor.

Board for Mounting Array Type Multilayer Ceramic Capacitor

Figure 7:
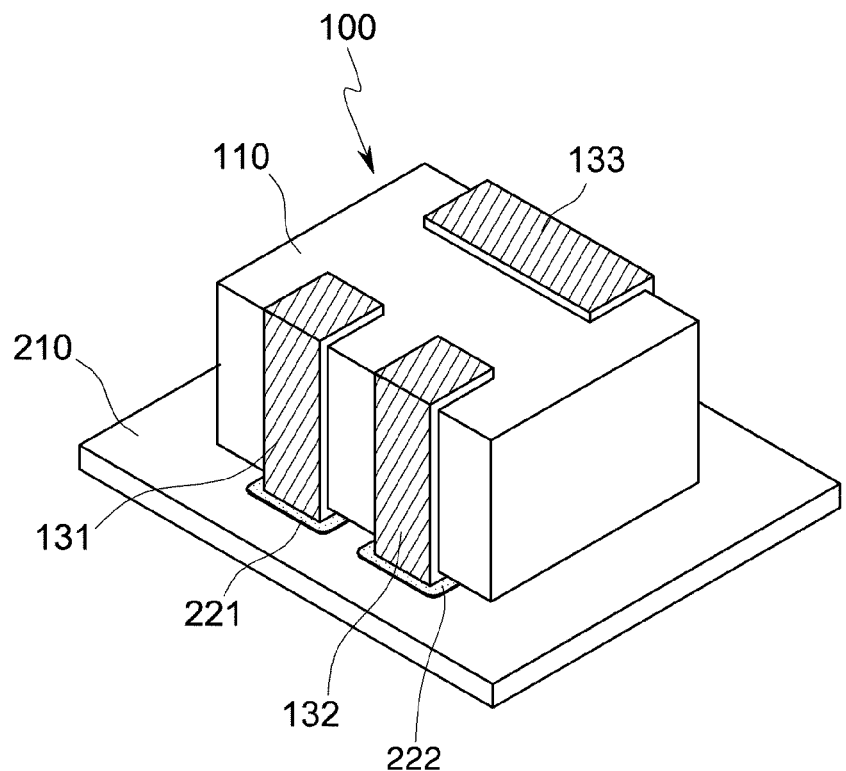
FIG. 7 is a perspective view schematically showing a form in which the array type multilayer ceramic capacitor according to the embodiment of the present invention is mounted on a printed circuit board.
Figure 8:
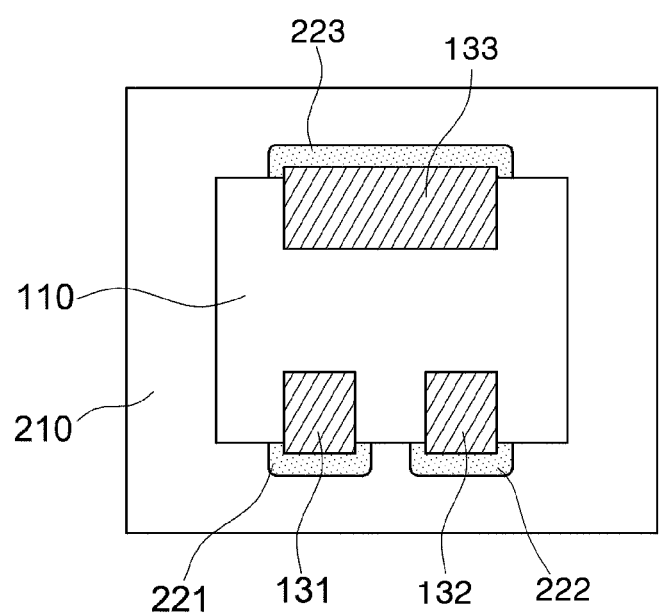
FIG. 8 is a plan view of FIG. 7.

FIG. 7 is a perspective view schematically showing a form in which the array type multilayer ceramic capacitor according to the embodiment of the present invention is mounted on a printed circuit board; and FIG. 8 is a plan view of FIG. 7.

Referring to FIGS. 7 and 8, a board 200 for mounting an array type multilayer ceramic capacitor according to the present embodiment may include a printed circuit board 210 and first to third electrode pads 221 to 223.

The second main surface of the ceramic body 110 of the array type multilayer ceramic capacitor 100 may be mounted on an upper surface of the printed circuit board 210.

The first and second electrode pads 221 and 222 and the third electrode pad 223 may be formed on the upper surface of the printed circuit board 210 so as to oppose each other in the width direction and be spaced apart from each other.

In addition, the first and second electrode pads 221 and 222 may be disposed to be spaced apart from each other by a predetermined interval in the length direction.

That is, the first to third electrode pads 221 to 223 may be formed on positions corresponding to those of the first to third external electrodes 131 to 133 of the array type multilayer ceramic capacitor 100 on the upper surface of the printed circuit board 210, respectively.

Therefore, the array type multilayer ceramic capacitor 100 may be electrically connected to the printed circuit board 210 by a solder (not shown) in a state in which the mounting surfaces of the first to third external electrodes 131 to 133 are positioned to contact the first to third electrode pads 221 to 223, respectively.

Meanwhile, in the case of a four-terminal array type multilayer ceramic capacitor including four external electrodes according to another embodiment of the present invention, a board for mounting the four-terminal array type multilayer ceramic capacitor may be configured so that four electrode pads are formed on the printed circuit board and the four external electrodes are mounted on the four electrode pads, respectively.

As set forth above, according to the embodiments of the present invention, voltages applied to the respective capacitor parts may be decreased, such that a high voltage may be used and the number of components may be decreased, whereby costs required for manufacturing the array-type multilayer ceramic electronic components may be decreased.

In addition, a plurality of capacitor parts may be configured to be connected to a single ceramic body, in a parallel structure, to decrease an area occupied by a plurality of multilayer ceramic electronic components individually mounted on a single board, whereby a size of the board for mounting the plurality of multilayer ceramic electronic components may be decreased.

Further, the number of pick-up operations of the multilayer ceramic electronic components performed when the multilayer ceramic electronic components are mounted on the printed circuit board may be decreased, whereby productivity of a product may be improved.

While the present invention has been shown and described in connection with the embodiments, it will be apparent to those skilled in the art that modifications and variations can be made without departing from the spirit and scope of the invention as defined by the appended claims.

What is claimed is:

1. An array type multilayer ceramic electronic component comprising:
    a ceramic body having a plurality of dielectric layers stacked in a length direction;
    a first capacitor part including a plurality of first and second internal electrodes alternately exposed through both side surfaces of the ceramic body, having the dielectric layer interposed therebetween;
    a second capacitor part disposed to be spaced apart from the first capacitor part in the length direction and including a plurality of third and fourth internal electrodes alternately exposed through both side surfaces of the ceramic body, having the dielectric layer interposed therebetween;
    a first external electrode formed on one side surface of the ceramic body and connected to exposed one end portions of the first and second internal electrodes;
    a second external electrode disposed to be spaced apart from the first external electrode in the length direction, formed on one side surface of the ceramic body, and connected to exposed one end portions of the third and fourth internal electrodes; and
    a third external electrode formed on the other side surface of the ceramic body and connecting the exposed other end portions of the first and second internal electrodes and the exposed other end portions of the third and fourth internal electrodes, to each other in series.

2. The array type multilayer ceramic electronic component of claim 1, wherein the first to third external electrodes are extended from both side surfaces of the ceramic body to portions of one main surface of the ceramic body.

3. The array type multilayer ceramic electronic component of claim 1, wherein the first to third external electrodes are extended from both side surfaces of the ceramic body to portions of both main surfaces of the ceramic body.

4. The array type multilayer ceramic electronic component of claim 1, wherein the dielectric layer of a section in which the first and second capacitor parts are divided from each other in the ceramic body is formed of a material having a dielectric constant lower than those of the dielectric layers of the first and second capacitor parts.

5. A board for mounting an array type multilayer ceramic electronic component, comprising:
    a printed circuit board including first and second electrode pads disposed on an upper surface thereof so as to be spaced apart from each other by a predetermined interval in a length direction and a third electrode pad disposed on the upper surface thereof so as to oppose the first and second electrode pads in a width direction; and
    the array type multilayer ceramic electronic component of claim 1, mounted on the first to third electrode pads.

6. An array type multilayer ceramic electronic component comprising:
    a ceramic body having a plurality of dielectric layers stacked in a length direction;
    a first capacitor part including a plurality of first and second internal electrodes alternately exposed through both side surfaces of the ceramic body, having the dielectric layer interposed therebetween;
    a second capacitor part disposed to be spaced apart from the first capacitor part in the length direction and including a plurality of third and fourth internal electrodes alternately exposed through both side surfaces of the ceramic body, having the dielectric layer interposed therebetween;
    a third capacitor part disposed to be spaced apart from the second capacitor part in the length direction and including a plurality of fifth and sixth internal electrodes alternately exposed through both side surfaces of the ceramic body, having the dielectric layer interposed therebetween;
    a first external electrode formed on one side surface of the ceramic body and connected to exposed one end portions of the first and second internal electrodes;
    a second external electrode disposed to be spaced apart from the first external electrode in the length direction, formed on one side surface of the ceramic body, and connecting exposed one end portions of the third and fourth internal electrodes and exposed one end portions of the fifth and sixth internal electrodes, to each other in series;
    a third external electrode formed on the other side surface of the ceramic body and connecting the exposed other end portions of the first and second internal electrodes and the exposed other end portions of the third and fourth internal electrodes, to each other in series; and
    a fourth external electrode disposed to be spaced apart from the third external electrode in the length direction, formed on the other side surface of the ceramic body, and connected to the exposed other end portions of the fifth and sixth internal electrodes.

7. The array type multilayer ceramic electronic component of claim 6, wherein the first to fourth external electrodes are extended from both side surfaces of the ceramic body to portions of one main surface of the ceramic body.

8. The array type multilayer ceramic electronic component of claim 6, wherein the first to fourth external electrodes are extended from both side surfaces of the ceramic body to portions of both main surfaces of the ceramic body.

9. The array type multilayer ceramic electronic component of claim 6, wherein the dielectric layers of sections in which the first to third capacitor parts are divided from each other in the ceramic body are formed of a material having a dielectric constant lower than those of the dielectric layers of the first to third capacitor parts.

10. A board for mounting an array type multilayer ceramic electronic component, comprising:
a printed circuit board including first and second electrode pads disposed on an upper surface thereof so as to be spaced apart from each other by a predetermined interval in a length direction and a third electrode pad disposed on the upper surface thereof so as to oppose the first and second electrode pads in a width direction; and
the array type multilayer ceramic electronic component of claim 9, mounted on the first to third electrode pads.

11. A method of manufacturing an array type multilayer ceramic electronic component, comprising:
forming a first capacitor part by stacking a plurality of ceramic sheets having first and second internal electrodes formed thereon so that the first and second internal electrodes are disposed to face each other, having the ceramic sheet interposed therebetween;
forming a second capacitor part by stacking a plurality of ceramic sheets having third and fourth internal electrodes formed thereon so that the third and fourth internal electrodes are disposed to face each other, having the ceramic sheet interposed therebetween;
preparing a multilayer laminate by stacking and pressing the first and second capacitor parts in a length direction so that a buffer layer formed of a plurality of ceramic sheets is disposed between the first and second capacitor parts;
preparing a ceramic body having first and second main surfaces opposing each other in a thickness direction, first and second end surfaces opposing each other in the length direction, and first and second side surfaces opposing each other in a width direction, to which the first and second internal electrodes are alternately exposed, by cutting the multilayer laminate into respective single chips to then be fired;
forming first and second external electrodes on the first side surface of the ceramic body so as to be spaced apart from each other and be connected to exposed one end portions of the first and second internal electrodes and exposed one end portions of the third and fourth internal electrodes, respectively; and
forming a third external electrode on the second side surface of the ceramic body so as to connect the exposed other end portions of the first and second internal electrodes and the exposed other end portions of the third and fourth internal electrodes, to each other in series.

12. The method of claim 11, wherein in the forming of the first to third external electrodes, the first to third external electrodes are extended from the first and second side surfaces of the ceramic body to portions of the first or second main surface of the ceramic body.

13. The method of claim 11, wherein in the forming of the first to third external electrodes, the first to third external electrodes are extended from the first and second side surfaces of the ceramic body to portions of the first and second main surfaces of the ceramic body.

14. The method of claim 11, wherein in the preparing of the multilayer laminate, the ceramic sheet of the buffer layer is formed of a material having a dielectric constant lower than those of the ceramic sheets of the first and second capacitor parts.

15. A method of manufacturing an array type multilayer ceramic electronic component, comprising:
forming a first capacitor part by stacking a plurality of ceramic sheets having first and second internal electrodes formed thereon so that the first and second internal electrodes are disposed to face each other, having the ceramic sheet interposed therebetween;
forming a second capacitor part by stacking a plurality of ceramic sheets having third and fourth internal electrodes formed thereon so that the third and fourth internal electrodes are disposed to face each other, having the ceramic sheet interposed therebetween;
forming a third capacitor part by stacking a plurality of ceramic sheets having fifth and sixth internal electrodes formed thereon so that the fifth and sixth internal electrodes are disposed to face each other, having the ceramic sheet interposed therebetween;
preparing a multilayer laminate by stacking and pressing the first to third capacitor parts in a length direction so that buffer layers formed of a plurality of ceramic sheets are disposed between the first to third capacitor parts, respectively;
preparing a ceramic body having first and second main surfaces opposing each other in a thickness direction, first and second end surfaces opposing each other in the length direction, and first and second side surfaces opposing each other in a width direction, to which the first and second internal electrodes are alternately exposed, by cutting the multilayer laminate into regions corresponding to respective single chips to then be fired;
forming a first external electrode on one side surface of the ceramic body so as to be connected to exposed one end portions of the first and second internal electrodes;
forming a second external electrode on one side surface of the ceramic body so as to connect exposed one end portions of the third and fourth internal electrodes and exposed one end portions of the fifth and sixth internal electrodes, to each other in series;
forming a third external electrode on the other side surface of the ceramic body so as to connect the exposed other end portions of the first and second internal electrodes and the exposed other end portions of the third and fourth internal electrodes, to each other in series; and
forming a fourth external electrode on the other side surface of the ceramic body so as to be connected to the exposed other end portions of the fifth and sixth internal electrodes.

16. The method of claim 15, wherein in the forming of the first to fourth external electrodes, the first to fourth external electrodes are extended from the first and second side surfaces of the ceramic body to portions of the first or second main surface of the ceramic body.

17. The method of claim 15, wherein in the forming of the first to fourth external electrodes, the first to fourth external electrodes are extended from the first and second side surfaces of the ceramic body to portions of the first and second main surfaces of the ceramic body.

18. The method of claim 15, wherein in the preparing of the multilayer laminate, the ceramic sheet of the buffer layer is formed of a material having a dielectric constant lower than those of the ceramic sheets of the first and second capacitor parts.

* * * * *